United States Patent
Gao et al.

(10) Patent No.: US 10,734,013 B2
(45) Date of Patent: Aug. 4, 2020

(54) SPIN TRANSFER TORQUE (STT) DEVICE WITH MULTILAYER SEED LAYERS FOR MAGNETIC RECORDING AND MEMORY

(71) Applicant: Western Digital Technologies, Inc., San Jose, CA (US)

(72) Inventors: Zheng Gao, San Jose, CA (US); Masahiko Hashimoto, San Jose, CA (US); Susumu Okamura, Fujisawa (JP); James Mac Freitag, Sunnyvale, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/277,835

(22) Filed: Feb. 15, 2019

(65) Prior Publication Data
US 2019/0259412 A1 Aug. 22, 2019

Related U.S. Application Data

(63) Continuation of application No. 16/144,784, filed on Sep. 27, 2018, now abandoned.
(Continued)

(51) Int. Cl.
*G11B 5/31* (2006.01)
*G11B 5/33* (2006.01)
(Continued)

(52) U.S. Cl.
CPC .............. *G11B 5/115* (2013.01); *G11B 5/147* (2013.01); *G11B 5/314* (2013.01); *G11B 5/3133* (2013.01);
(Continued)

(58) Field of Classification Search
None
See application file for complete search history.

(56) References Cited

U.S. PATENT DOCUMENTS 7,002,775 B2 2/2006 Hsu et al.
7,982,996 B2 7/2011 Smith et al.
(Continued)

FOREIGN PATENT DOCUMENTS

CN 104835510 B 11/2017
JP 2013251042 A 12/2013
(Continued)

OTHER PUBLICATIONS

Mallory, Mike et al; "Head and Media Challenges for 3 Tb/in2 Microwave-Assisted Magnetic Recording"; IEEE Transactions on Magnetics, vol. 50, No. 7, Jul. 2014 (8 pages).
(Continued)

*Primary Examiner* — Jefferson A Evans
(74) *Attorney, Agent, or Firm* — Patterson & Sheridan, LLP; Steven H. Versteeg (57) ABSTRACT

Spin transfer torque (STT) devices with multilayer seed layers that can be used in magnetic recording and memory are provided. One such STT device includes a substrate, and a stack of layers formed on the substrate, where the stack includes a first seed layer directly on the substrate and including Cr, a second seed layer on the first seed layer and including Ta, a ferromagnetic free layer on the second seed layer; a ferromagnetic polarizing layer, and a nonmagnetic spacer layer between the free layer and the polarizing layer. One such method includes fabricating the STT device.

29 Claims, 10 Drawing Sheets

Related U.S. Application Data (60) Provisional application No. 62/567,597, filed on Oct. 3, 2017.

(51) Int. Cl.

| | | |
|---|---|---|
| *H01L 27/22* | (2006.01) | |
| *H01L 43/02* | (2006.01) | |
| *G11B 5/115* | (2006.01) | |
| *G11B 5/147* | (2006.01) | |
| *G11B 5/39* | (2006.01) | |
| *G11B 5/23* | (2006.01) | |
| *G11B 5/235* | (2006.01) | |

(52) U.S. Cl.
CPC .......... *G11B 5/3153* (2013.01); *H01L 27/222* (2013.01); *H01L 43/02* (2013.01); *G11B 5/23* (2013.01); *G11B 5/235* (2013.01); *G11B 5/3146* (2013.01); *G11B 5/3909* (2013.01)

(56) References Cited

U.S. PATENT DOCUMENTS

| | | | |
|---|---|---|---|
| 8,259,409 B2 | 9/2012 | Braganca et al. | |
| 8,488,373 B2 | 7/2013 | Zhang et al. | |
| 8,582,240 B1 | 11/2013 | Chen et al. | |
| 8,970,996 B2 | 3/2015 | Nagasaka et al. | |
| 9,230,569 B1 | 1/2016 | Shimoto et al. | |
| 9,230,571 B1 | 1/2016 | Chen et al. | |
| 9,275,672 B2 | 3/2016 | Shiroishi et al. | |
| 9,368,135 B2 | 6/2016 | Gao | |
| 9,831,421 B2 * | 11/2017 | Wang | H01F 10/3286 |
| 9,881,637 B1 | 1/2018 | Wilson et al. | |
| 10,050,083 B2 * | 8/2018 | Gan | H01L 43/10 |
| 10,121,497 B1 | 11/2018 | Takahashi et al. | |
| 10,186,284 B2 | 1/2019 | Narita et al. | |
| 10,236,021 B2 | 3/2019 | Narita et al. | |
| 10,276,193 B2 | 4/2019 | Narita et al. | |
| 10,325,618 B1 | 6/2019 | Wu et al. | |
| 10,366,714 B1 | 7/2019 | Olson et al. | |
| 10,410,658 B1 * | 9/2019 | Liu | G11B 5/7369 |
| 2008/0304176 A1 | 12/2008 | Takagishi et al. | |
| 2009/0059423 A1 | 3/2009 | Yamada et al. | |
| 2009/0310244 A1 | 12/2009 | Shimazawa et al. | |
| 2011/0279921 A1 | 11/2011 | Zhang et al. | |
| 2013/0250456 A1 | 9/2013 | Yamada et al. | |
| 2014/0139952 A1 | 5/2014 | Takeo et al. | |
| 2014/0177100 A1 | 6/2014 | Sugiyama et al. | |
| 2015/0008550 A1 | 1/2015 | Min et al. | |
| 2015/0325783 A1 * | 11/2015 | Wang | H01F 10/3286 |
| | | | 257/421 |
| 2016/0027455 A1 | 1/2016 | Kudo et al. | |
| 2016/0155932 A1 | 6/2016 | Chen et al. | |
| 2017/0033156 A1 | 2/2017 | Gan et al. | |
| 2017/0236537 A1 | 8/2017 | Murakami et al. | |
| 2017/0301855 A1 * | 10/2017 | Zhang | H01L 43/08 |
| 2017/0309301 A1 * | 10/2017 | Takahashi | G11B 5/3912 |
| 2018/0268848 A1 | 9/2018 | Narita et al. | |
| 2019/0051822 A1 * | 2/2019 | Chatterjee | H01L 27/222 |
| 2019/0088274 A1 | 3/2019 | Narita et al. | |
| 2019/0198078 A1 * | 6/2019 | Hoang | H01L 43/02 |
| 2019/0198566 A1 * | 6/2019 | Wang | H01L 43/08 |
| 2019/0259412 A1 * | 8/2019 | Gao | G11B 5/115 |
| 2019/0279666 A1 * | 9/2019 | Freitag | G11B 5/3909 |
| 2019/0279668 A1 * | 9/2019 | Freitag | G11B 5/1278 |
| 2019/0288031 A1 * | 9/2019 | Satoh | G11C 11/1675 |
| 2019/0304521 A1 * | 10/2019 | Tahmasebi | G11C 11/1657 |
| 2019/0304522 A1 * | 10/2019 | Tahmasebi | G11C 11/1657 |
| 2019/0305210 A1 * | 10/2019 | Tahmasebi | G11C 11/161 |

FOREIGN PATENT DOCUMENTS

| | | |
|---|---|---|
| WO | 2015126326 A1 | 8/2015 |
| WO | 2017165058 A1 | 9/2017 |

OTHER PUBLICATIONS

International Search Report and the Written Opinion for International Application No. PC/US2018/052296 dated Jan. 7, 2019.

Braganca et al. "Nanoscale magnetic field detection using a spin torque oscillator," Nanotechnology, 2010, vol. 21, No. 23, 13 pages, 10.1088/0957-4484/21/23/235202.

Chen "Spin Torque Oscillator-based Integrated Solutions for Magnetic Field Sensing and Wireless Communication Applications", 2014 21st IEEE International Conference on Electronics, Circuits and Systems (ICECS), 2 pages.

Zhu et al. "Microwave Assisted Magnetic Recording", IEEE Transactions on Magnetics, vol. 44, No. 1, Jan. 2008, pp. 125-131.

Kittel "On the Theory of Ferromagnetic Resonance Absorption", Physical Review, vol. 73, No. 2, Jan. 15, 1948, pp. 155-161.

* cited by examiner

SPIN TRANSFER TORQUE (STT) DEVICE WITH MULTILAYER SEED LAYERS FOR MAGNETIC RECORDING AND MEMORY

CROSS-REFERENCE TO RELATED APPLICATIONS

This application is a continuation of co-pending U.S. patent application Ser. No. 16/144,784, filed Sep. 27, 2018, which claims benefit of U.S. Provisional Patent Application Ser. No. 62/567,597, filed Oct. 3, 2017. Each of the aforementioned related patent applications is herein incorporated by reference.

FIELD

This invention relates generally to magnetic recording systems, and more particularly to spin transfer torque (STT) devices with multilayer seed layers that can be used in magnetic recording and memory.

INTRODUCTION

Spin transfer torque (STT) is an effect in which the orientation of the magnetization of a magnetic layer in a magnetic tunnel junction (MTJ) or giant magnetoresistance (GMR) spin valve can be modified using a spin-polarized current. Electrons have a property known as spin, which is a small quantity of angular momentum. An electric current is generally unpolarized (i.e., consisting of 50% spin-up and 50% spin-down electrons), while a spin-polarized current is one with more electrons of either spin. Spin-polarized current can be produced by passing a current through a thick magnetic layer (usually called the "fixed" layer or "polarizing" layer). When spin-polarized current above a critical current density is directed into a second, thinner magnetic layer (the "free" layer), angular momentum can be transferred to the free layer, changing the orientation of the free layer's magnetization. This can be used to excite oscillations of the free layer's magnetization, as in a spin-torque oscillator (STO) type of STT device, or flip the orientation of the free layer's magnetization, as in STT memory cells in a non-volatile magnetic random access memory (MRAM) storage device.

The spin-torque oscillator (STO) type of STT device has been proposed for sensing magnetic fields, as described by P. M. Braganca, et al., "Nanoscale magnetic field detection using a spin torque oscillator," Nanotechnology, vol. 21, no. 23, p. 235202, 2010, and in U.S. Pat. No. 8,259,409 assigned to the same assignee as this application. The STO has also been proposed for wireless communications applications, as described by T. Chen, "Spin Torque Oscillator-based Integrated Solutions for Magnetic Field Sensing and Wireless Communication Applications", Electronics, Circuits and Systems (ICECS), 2014 21st IEEE International Conference on (pp. W005-), IEEE conference proceedings. A STO type of STT device has also been proposed for perpendicular magnetic recording (PMR) systems, like a PMR disk drive, by incorporation of the STO into the disk drive's conventional write head.

Perpendicular magnetic recording (PMR) in magnetic recording hard disk drives, where the recorded bits are stored in a perpendicular or out-of-plane orientation in the magnetic recording layer of the disk, allows for ultra-high recording density (e.g., the areal density of the recorded bits on the disk). However, an increase in recording density requires a corresponding reduction in the size of the magnetic grains in the magnetic recording layer to achieve sufficient medium signal-to-noise ratio. As the size of the magnetic grains is reduced, the magneto-crystalline anisotropy of the magnetic grains must be increased to maintain adequate thermal stability. Simultaneously, the magnetic write field from the write head should exceed the coercivity of the magnetic recording layer to achieve saturation digital recording, resulting in a conflicted limitation on the anisotropy of the magnetic grains.

PMR systems have been proposed that use a spin-torque oscillator (STO) incorporated into the disk drive's conventional write head. In one type of system using a STO, called microwave assisted magnetic recording (MAMR), a high frequency oscillatory auxiliary magnetic field from a ferromagnetic free layer or field generation layer (FGL) in the STO is applied to the magnetic grains of the recording layer. The auxiliary field may have a frequency close to the resonance frequency of the magnetic grains in the recording layer to facilitate the switching of the magnetization of the grains at lower write fields from the conventional write head than would otherwise be possible without assisted recording. Conversely, MAMR may be used to increase the coercivity of the magnetic recording layer above that which could be written to by a conventional PMR alone. The increase in coercivity afforded by MAMR allows for a reduction in the size of the magnetic grains and thus a corresponding increase in recording density. MAMR systems are described by J. G. Zhu et al., "Microwave Assisted Magnetic Recording", IEEE Transactions on Magnetics, Vol. 44, No. 1, January 2008, pp. 125-131; and in U.S. Pat. Nos. 7,982,996 and 8,970,996, both assigned to the same assignee as this application.

In a PMR system with a STO incorporated into the disk drive's conventional write head, even if the oscillatory auxiliary magnetic field from the free layer does not provide microwave assistance to writing, the free layer can have a DC field component that will assist writing by the conventional write head.

In one proposed system, the STO is located between the write pole and the trailing magnetic shield of the write head. The STO electrical circuitry is connected to either separate electrodes, or to the write pole and trailing shield which function as the electrodes. The STO is a multilayer film stack made up of two or more ferromagnetic layers separated by a nonmagnetic electrically-conducting spacer layer. One of the ferromagnetic layers, the free layer, may be located adjacent the write pole and is designed to have its magnetization orientation oscillate in the presence of STO current perpendicular to the film planes. Another ferromagnetic layer, the polarizer or polarizing layer (PL), may be located adjacent the trailing shield and is designed to supply spin-polarized electrons to the free layer in the presence of the STO current. The STO electrical circuitry supplies DC current to the STO (e.g., switching current), with the electron flow being from the write pole to the trailing shield. A seed layer may be positioned between the free layer and write pole to assist formation of the free layer. However, in certain applications, the seed layer may develop undesirable characteristics such as a high resistance to current. As a result, a magnitude of the switching current may be undesirably high.

SUMMARY

In one aspect, the disclosure provides a spin transfer torque (STT) device comprising a substrate; and a stack of layers formed on the substrate and comprising: a first seed layer directly on the substrate and comprising Cr; a second seed layer on the first seed layer and comprising Ta; a ferromagnetic free layer on the second seed layer; a ferromagnetic polarizing layer, and a nonmagnetic spacer layer between the free layer and the polarizing layer.

In another aspect, the disclosure provides a spin transfer torque (STT) device comprising: a substrate; and a stack of layers formed on the substrate and comprising: a first seed layer directly on the substrate and comprising Cr; a second seed layer directly on the first seed layer and comprising Ru; a ferromagnetic free layer on the second seed layer; a ferromagnetic polarizing layer, and a nonmagnetic spacer layer between the free layer and the polarizing layer.

In another aspect, the disclosure provides a method for fabricating a spin transfer torque (STT) device, comprising: providing a substrate; and providing a stack of layers on the substrate, the providing the stack comprising: providing a first seed layer directly on the substrate and comprising Cr; providing a second seed layer on the first seed layer and comprising Ta; providing a ferromagnetic free layer on the second seed layer; providing a ferromagnetic polarizing layer, and providing a nonmagnetic spacer layer between the free layer and the polarizing layer.

DETAILED DESCRIPTION

Referring now to the drawings, spin transfer torque (STT) devices with multilayer seed layers used in magnetic recording and memory and methods of forming such devices are illustrated. One such STT device includes a substrate and a stack of layers formed on the substrate, where the stack includes a first seed layer directly on the substrate and comprising Cr, a second seed layer on the first seed layer and comprising Ta, a ferromagnetic free layer on the second seed layer, a ferromagnetic polarizing layer, and a nonmagnetic spacer layer between the free layer and the polarizing layer. In one aspect, the STT device may be a spin torque oscillator (STO). In one aspect, the improved STT devices described herein can provide performance advantages over conventional STT/STO devices, including, among other things, reduced resistivity of the seed layers, improved ferromagnetic coupling (Hin), and improved adhesion between the seed layers and adjacent layers.

Figure 1:
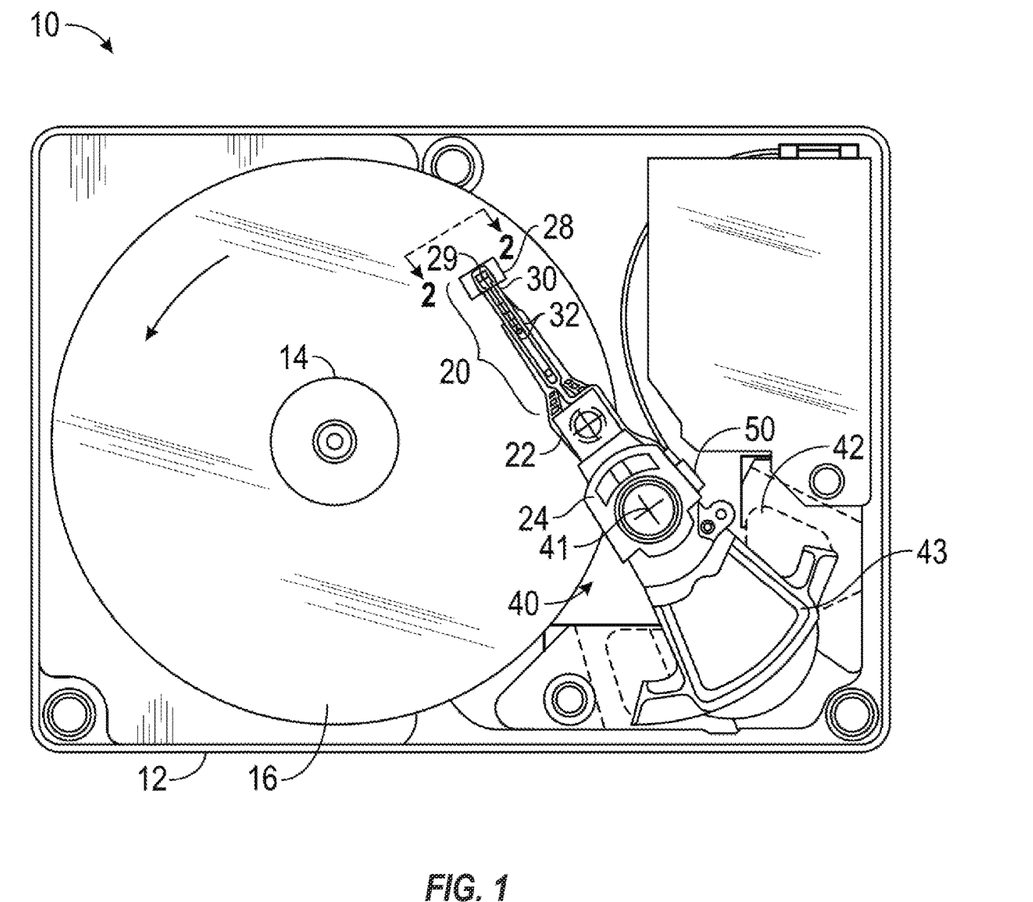
FIG. 1 is a top plan view of a head/disk assembly of a hard disk drive with the cover removed in accordance with one embodiment of the disclosure.

FIG. 1 is a top plan view of a head/disk assembly of a hard disk drive 10 with the cover removed in accordance with one embodiment of the disclosure. The disk drive 10 includes a rigid base 12 supporting a spindle 14 that supports a stack of disks, including top disk 16. The spindle 14 is rotated by a spindle motor (not shown) for rotating the disks in the direction shown by curved arrow on disk 16. The hard disk drive 10 has at least one load beam assembly 20 having an integrated lead suspension (ILS) or flexure 30 with an array 32 of electrically conductive interconnect traces or lines. The load beam assemblies 20 are attached to rigid arms 22 connected to an E-shaped support structure, sometimes called an E block 24. Each flexure 30 is attached to an air-bearing slider 28.

A magnetic recording read/write head 29 is located at the end or trailing surface 25 of slider 28. In embodiments of this disclosure the write head 29 will incorporate a spin-torque oscillator (STO) (not shown). The flexure 30 enables the slider 28 to "pitch" and "roll" on an air bearing generated by the rotating disk 16. Disk drive 10 also includes a rotary actuator assembly 40 rotationally mounted to the rigid base 12 at a pivot point 41. The actuator assembly 40 is a voice coil motor (VCM) actuator that includes a magnet assembly 42 fixed to base 12 and a voice coil 43. When energized by control circuitry (not shown) the voice coil 43 moves and thereby rotates E block 24 with attached arms 22 and load beam assemblies 20 to position the read/write heads 29 to the data tracks on the disks. The trace interconnect array 32 connects at one end to the read/write head 29 and at its other end to read/write circuitry contained in an electrical module or chip 50 secured to a side of the E-block 24. The chip 50 includes a read preamplifier and a write driver circuit. In one aspect, read/write head 29 can include a STT/STO device with a multilayer seed layer. Embodiments of these devices are described in detail below.

Figure 2:
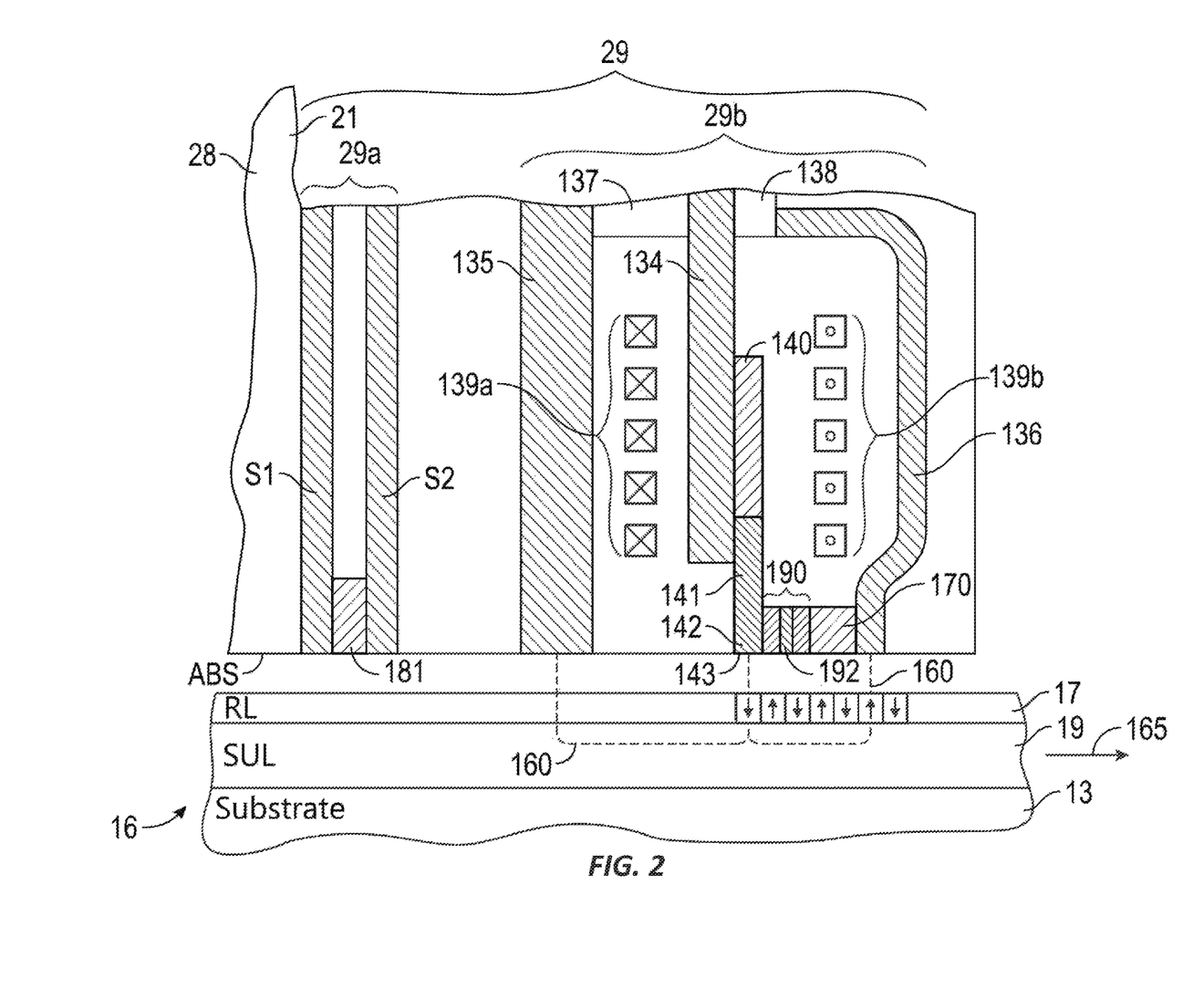
FIG. 2 is a side sectional view of a perpendicular magnetic recording (PMR) write head with an incorporated spin-torque oscillator (STO), a read head and a recording disk taken through a central plane that intersects a data track on the disk in accordance with one embodiment of the disclosure.

FIG. 2 is a side sectional view of a perpendicular magnetic recording (PMR) write head with an incorporated spin-torque oscillator (STO), a read head and a recording disk taken through a central plane that intersects a data track on the disk in accordance with one embodiment of the disclosure. As shown in FIG. 2, a "dual-layer" disk 16 includes a perpendicular magnetic data recording layer (RL) 17 on a "soft" or relatively low-coercivity magnetically permeable underlayer (SUL) 19 formed on the disk substrate 13. The read/write head 29 is formed on slider 28 and includes read head 29a and write head 29b. Read head 29a includes a magnetoresistive (MR) read element or sensor 181 located between two magnetic shields S1, S2.

The write head 29b is a single write pole type of perpendicular magnetic recording (PMR) write head and includes a yoke structure with main pole 134, write pole 140, first flux return pole 135, second flux return pole 136, trailing magnetic shield 170, STO 190 between write pole 140 and trailing shield 170, and yoke studs 137, 138 connecting the main pole and return poles 135, 136 respectively. The write head 29b also includes a thin film coil 139a, 139b shown in section around main pole 134. The write coil 139a, 139b is a helical coil wrapped around main pole 134, but the write coil may also be a conventional dual "pancake" coil in which all the coil sections are in substantially the same plane and wrapped around the yoke. A flared write pole (WP) 140 is part of the main pole 134 and has a flared portion 141 and a pole tip 142 with an end 143 that faces the outer surface of disk 16. Write current through coil 139a, 139b induces a magnetic field (shown by dashed line 160) from the WP 140 that passes through the RL 17 (to magnetize the region of the RL 17 beneath the WP 140), through the flux return path provided by the SUL 19, and back to the ends 35a, 36a of return poles 135, 136, respectively.

The read/write head 29 is typically formed as a series of thin films deposited on a trailing surface 21 of air bearing slider 28 that has its air bearing surface (ABS) supported above the surface of disk 16. The MR read head 29a is comprised of MR sensor 181 located between MR shields S1 and S2 and is deposited on the trailing end 21 of the slider 28 prior to the deposition of the layers making up the write head 29b. In FIG. 2, the disk 16 moves past the write head 29b in the direction indicated by arrow 165, so the portion of slider 28 that supports the read head 29a and write head 29b is often called the slider "trailing" end, and the surface 21 perpendicular to the slider ABS on which the write head 29b is located is often called the slider "trailing" surface.

The RL 17 is illustrated with perpendicularly recorded or magnetized regions, with adjacent regions having opposite magnetization directions, as represented by the arrows. The magnetic transitions between adjacent oppositely directed magnetized regions are detectable by the MR sensor 181 as the recorded bits.

In one aspect, the STO 190 may include a multilayer seed layer. Embodiments of these devices are described in detail below.

FIG. 2 also illustrates a trailing shield (TS) 170 spaced from WP 140. The TS 170 is formed of ferromagnetic material. The STO 190 is located between WP 140 and TS 170. The STO 190 includes a ferromagnetic free layer 192 whose magnetization precesses in the presence of DC current from electrical circuitry (not shown) connected to the WP 140 and the TS 170.

Figure 3:
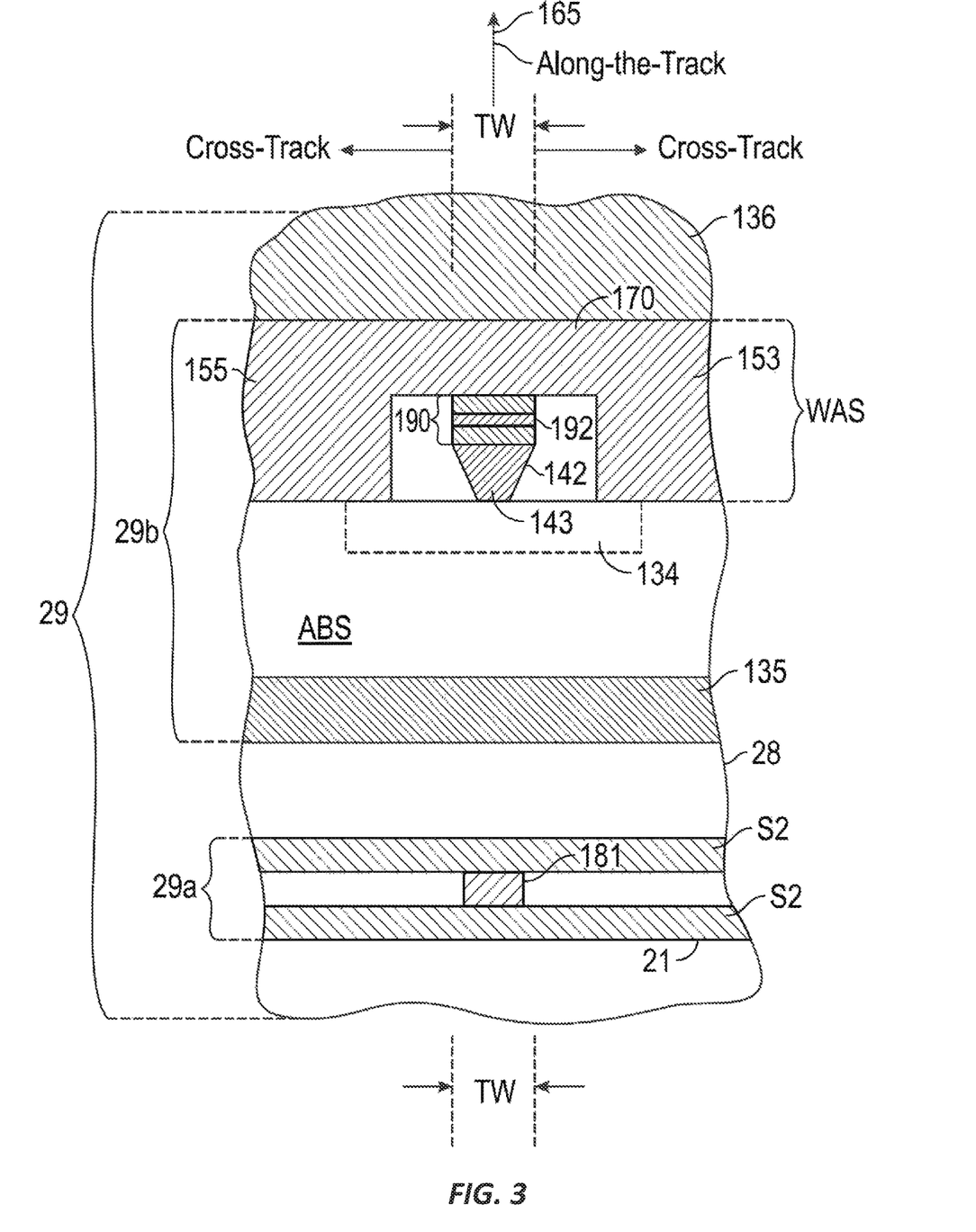
FIG. 3 is a view of the read/write head of FIG. 2 as seen from the disk in accordance with one embodiment of the disclosure.

FIG. 3 is a view of the read/write head 29 of FIG. 2 as seen from the disk in accordance with one embodiment of the disclosure. The ABS is the recording layer facing surface of the slider 28 that faces the disk 16 (FIG. 2) and is shown without the thin protective overcoat typically present in an actual slider. The recording layer facing surface shall mean the surface of the slider 28 that is covered with a thin protective overcoat, the actual outer surface of the slider if there is no overcoat, or the outer surface of the overcoat. The phrase "substantially at the recording layer facing surface" shall mean actually at the surface or slightly recessed from the surface. The disk 16 (FIG. 2) moves relative to the read/write head 29 in the direction 165, which is called the along-the-track direction. The direction perpendicular to direction 165 and parallel to the plane of the ABS is called the cross track direction. The width of the end 143 of WP tip 142 in the cross-track direction substantially defines the track width (TW) of the data tracks in the RL 17 (FIG. 2). The main pole 134 is shown with dashed lines because it is recessed from the ABS (see FIG. 2).

The portions identified as 153, 155 on opposite ends of TS 170 are side shields which, together with TS 170, form a wraparound shield (WAS) that generally surrounds the WP tip 142. The WAS that includes side shields 153, 155 and TS 170 is described in detail as a shield for a conventional perpendicular recording head in U.S. Pat. No. 7,002,775, assigned to the same assignee as this application. The shields 170, 153, 155 all have ends substantially at the recording layer facing surface. The shields 170, 153, 155 are formed as a single-piece structure to form the WAS that substantially surrounds the WP tip 142 and are thus formed of the same material, typically a NiFe, CoFe or NiFeCo alloy, so that they have the same alloy composition. The side shields 153, 155 are separated from WP tip 142 by nonmagnetic gap material. The STO 190 with free layer 192 is located between the WP tip 142 and the TS 170. The WAS alters the angle of the write field and improves the write field gradient at the point of writing, and also shields the writing field at regions of the RL away from the track being written. The WAS is shown as connected to the return pole 136. However, the WAS may be a "floating" WAS shield not connected to either the return pole 136 or other portions of the yoke by flux-conducting material. Also, instead of a WAS, the write head 29b may have separate side shields not connected to the TS 170.

An embodiment of the invention is a spin-torque oscillator (STO) wherein one of the electrodes connected to the STO is formed of a magnetic material, and a nonmagnetic seed layer is located between the ferromagnetic electrode and the free layer. The other electrode may be formed of a magnetic or nonmagnetic material.

Figure 4:
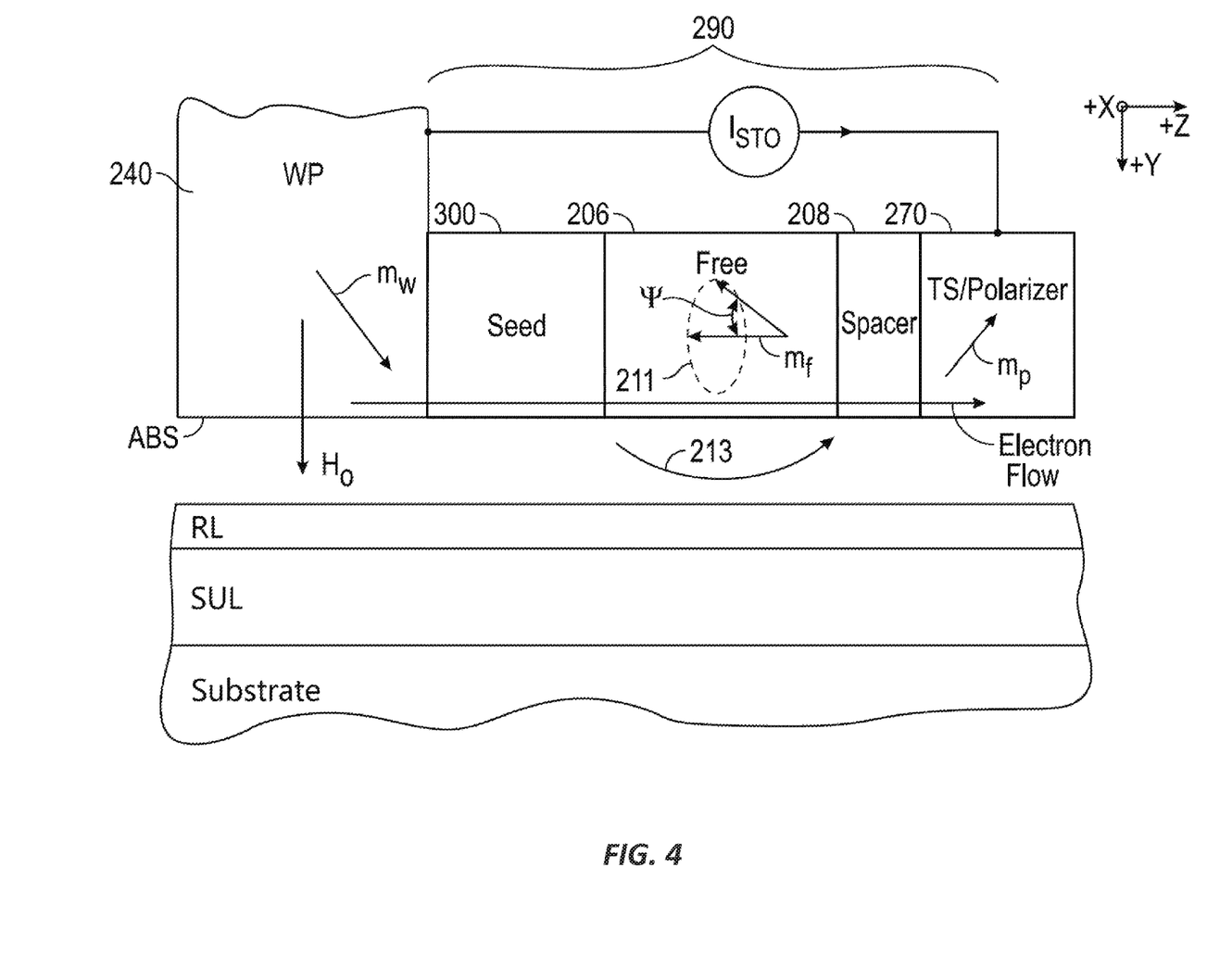
FIG. 4 is a side sectional view of a PMR write head with a STO incorporated into the write head and having a multilayer seed layer in accordance with an embodiment of the disclosure.
Figure 10:
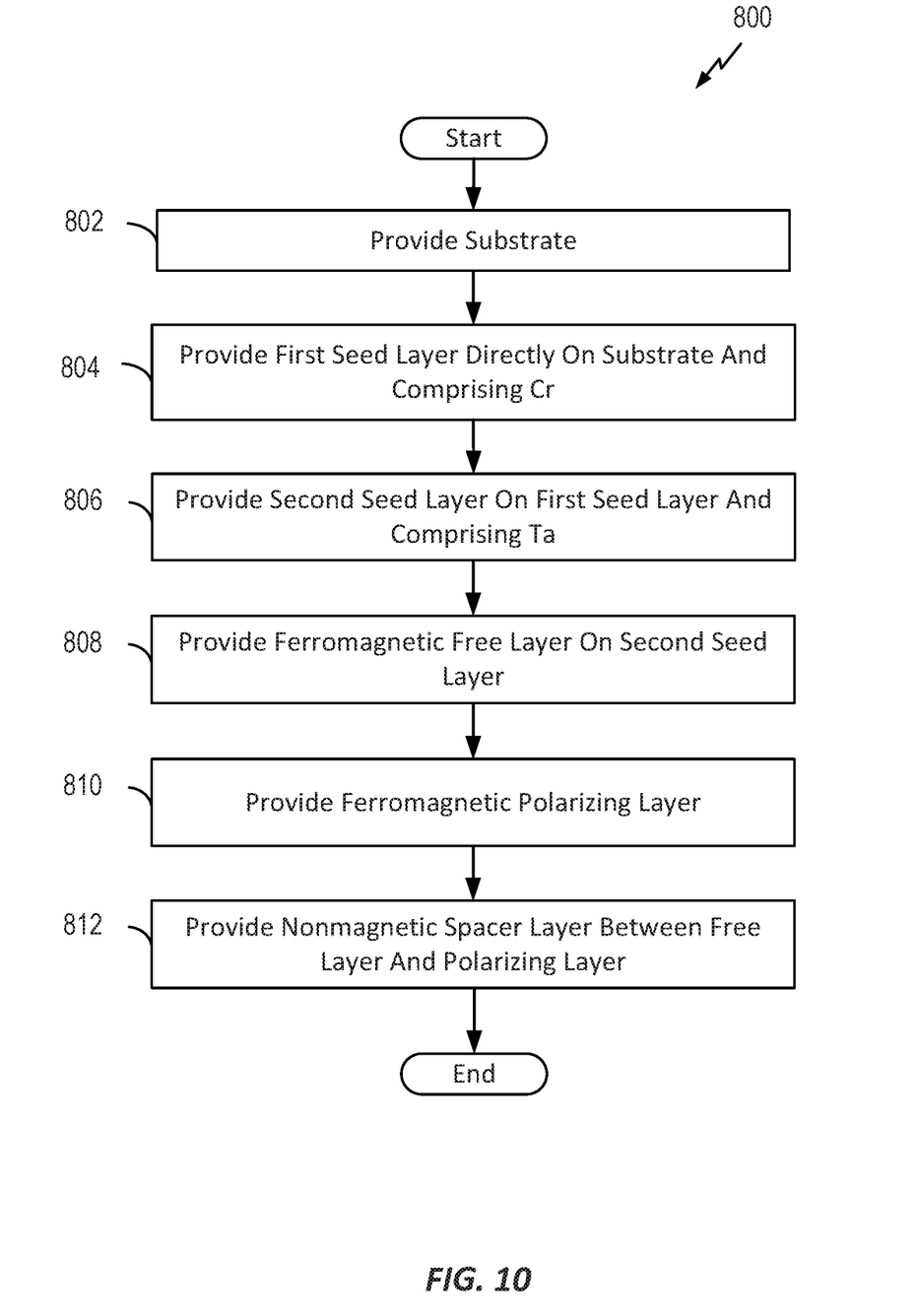
FIG. 10 is a flow chart illustrating a process for fabricating a multilayer seed layer in accordance with an embodiment of the disclosure.

FIG. 4 is a side sectional view of a PMR write head with a STO 290 incorporated into the write head and having a multilayer seed layer 300 in accordance with an embodiment of the disclosure. The WP 240 functions as a first electrode and is formed of a ferromagnetic material. The TS 270 functions as the second electrode, and in this embodiment, is also formed of a ferromagnetic material. The STO electrical circuitry is connected between both electrodes and during writing provides DC current $I_{STO}$ between the WP 240 and the TS 270. The WP 240 has a magnetization ($m_w$) and thus generates spin-polarized electrons when write current is applied to the write coil. The electron flow, by convention, is in the opposite direction from the WP 240 to the TS 270. The TS 270, which is formed of ferromagnetic material like CoFe, acts as the polarizer, i.e. the supplier of spin-polarized electrons, for the STO 290 and has a magnetization ($m_p$). The STO's ferromagnetic free layer 206 has an edge substantially at the ABS and has its magnetization ($m_f$) free to rotate. A nonmagnetic spacer layer 208 is located between the free layer 206 and the polarizer/TS 270. The nonmagnetic spacer layer 208 is typically formed of Cu, but may also be formed of other materials like Au or Ag. A nonmagnetic electrically-conducting multilayered seed layer 300 is located between the WP 240 and the free layer 206. The stack of layers making up the STO 290 can be formed on the slider body after the write pole 240 is formed, using conventional deposition and lithographic techniques well-known in the fabrication of thin film read/write heads. A fabrication process for such an STO 290 is illustrated in FIG. 10 and described below.

In operation of the STO 290, DC current ($I_{STO}$), with a current density J above a critical value $J_C$, is applied across the WP 240 and the TS 270. The flow of electrons is from the WP 240 through the seed layer 300 and free layer 206 to polarizer/TS 270, where the electrons are reflected and become spin-polarized. The reflected spin-polarized electrons apply a spin torque on the magnetization $m_f$ of the free layer 206. This induces a precessional motion of the magnetization $m_f$ of the free layer 206 in the opposite direction to the magnetization of the TS/polarizer layer $m_p$. The polarizer magnetization $m_p$ is oriented slightly up and away from the RL in the presence of the write field $H_0$ from the WP 240. The free layer magnetization $m_f$ makes an angle $\Psi$ with the X-Y plane and has a component in the X-Y plane that rotates at an azimuthal angle about the Z-axis with a certain frequency f. The rotation of the free layer magnetization about the Z-axis at this approximately fixed angle $\Psi$ is depicted by the oval 211 which represents a circular precessional motion of the tip of the magnetization vector $m_f$ lying in a plane parallel to the X-Y plane. The frequency of precession depends on the properties and thicknesses of the materials making up the STO 290, but for a specific STO the frequency of precession is a function of the values of both $I_{STO}$ and $H_0$.

During writing, the WP 240 applies a write field $H_0$ to the magnetic grains in the recording layer (RL) at the same time the precession of the free layer magnetization $m_f$ from the STO 290 applies an auxiliary ac field at frequency f to the magnetic grains. This results in microwave-assisted magnetic recording (MAMR), which improves the switching of the magnetization of the grains in the RL, with the improvement depending on the frequency f at which the auxiliary field is applied. As is well known in the art, ferromagnetic materials absorb energy from AC magnetic fields more efficiently at or near their ferromagnetic resonance frequency, as described in Kittel C., "On the Theory of Ferromagnetic Resonance Absorption", *Phys. Rev.* 73, pp. 155-161 (1948). Accordingly, the frequency f of the auxiliary magnetic field from the free layer 206 of the STO 290 is designed to be preferably within a range near the ferromagnetic resonance of the magnetic material making up the grains in the RL, e.g., about 30-50 GHz. As a result, the write field required from the conventional PMR write head can be reduced from what would be required to switch the magnetization of the grains in the RL without MAMR. Conversely, MAMR may be used to increase the coercivity of the RL above that which could be written to by a conventional PMR write head alone. However, even if the frequency f of the auxiliary magnetic field from the free layer 206 is not near the resonance of the magnetic material in the grains of the RL, so that there is no microwave assistance, the magnetization $m_f$ will still provide a DC field component, as shown by arrow 213, that will assist the write field $H_0$. When write current from the coil is switched, the write field is switched from the direction into the RL (as depicted in FIG. 4) to out of the RL, which results in a switching of directions of the magnetizations $m_w$, $m_p$ and $m_f$, as well as the direction of DC field component 213.

Figure 5:
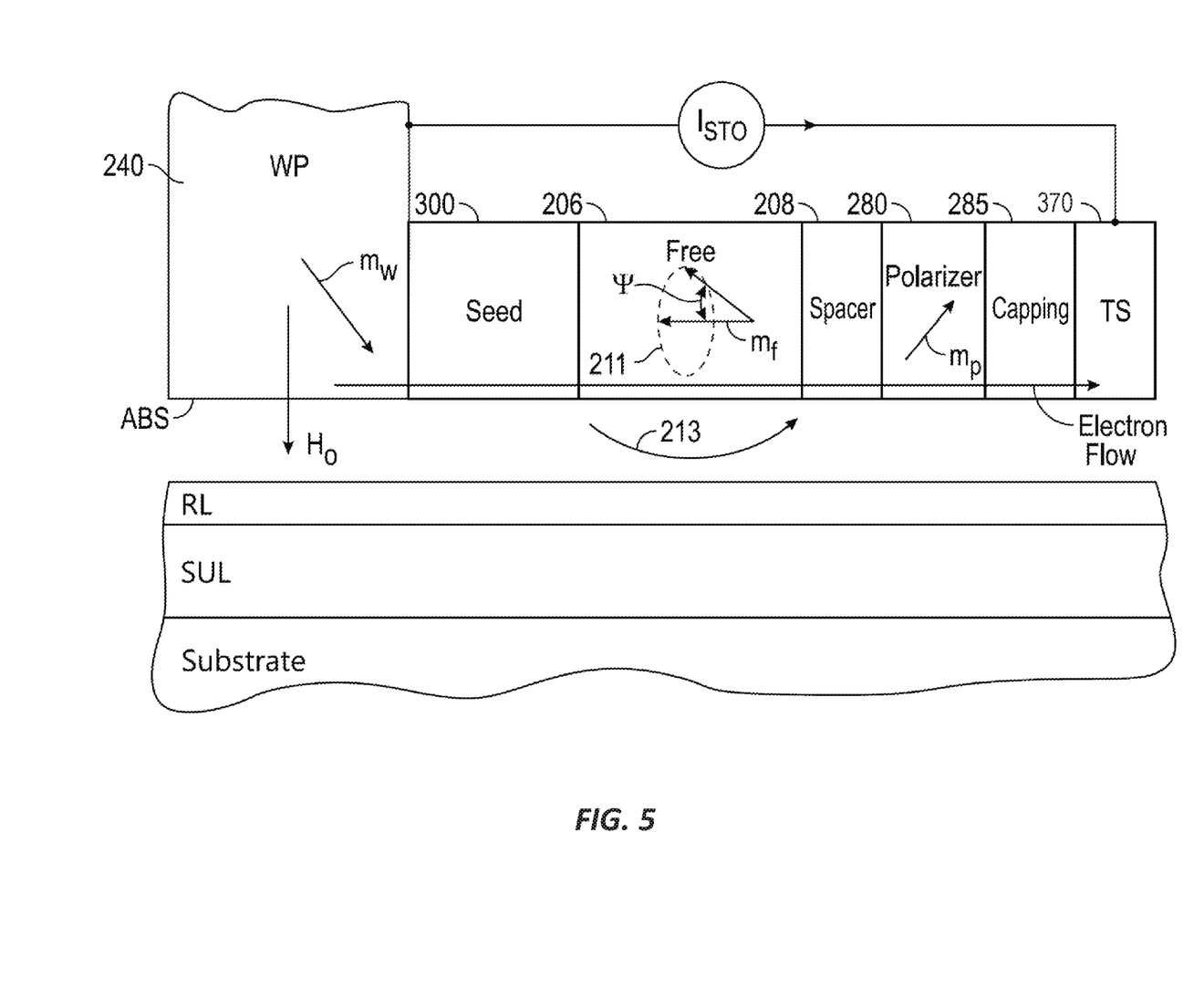
FIG. 5 is a side sectional view of a PMR write head with a STO incorporated into the write head and having a multilayer seed layer in accordance with another embodiment of the disclosure.

FIG. 5 is a side sectional view of a PMR write head with a STO incorporated into the write head and having a multilayer seed layer 300 in accordance with another embodiment of the disclosure. In this embodiment, there is a separate polarizer layer 280 adjacent the spacer layer 208 and a nonmagnetic capping layer 285 between the polarizer layer 280 and the TS 370. In one aspect, the polarizer layer 280 may be formed of a magnetic material having high moment and spin polarization (e.g., CoFe). In another aspect, the polarizer layer 280 is also a multilayer, like multilayer free layer 206 in FIG. 5, comprising a CoFe nanolayer, a template layer and a Heusler alloy layer. The capping layer 285 may be formed of a layer or multilayer of metals or metal alloys like Ru, Ir, Ta and/or Ti.

Figure 6:
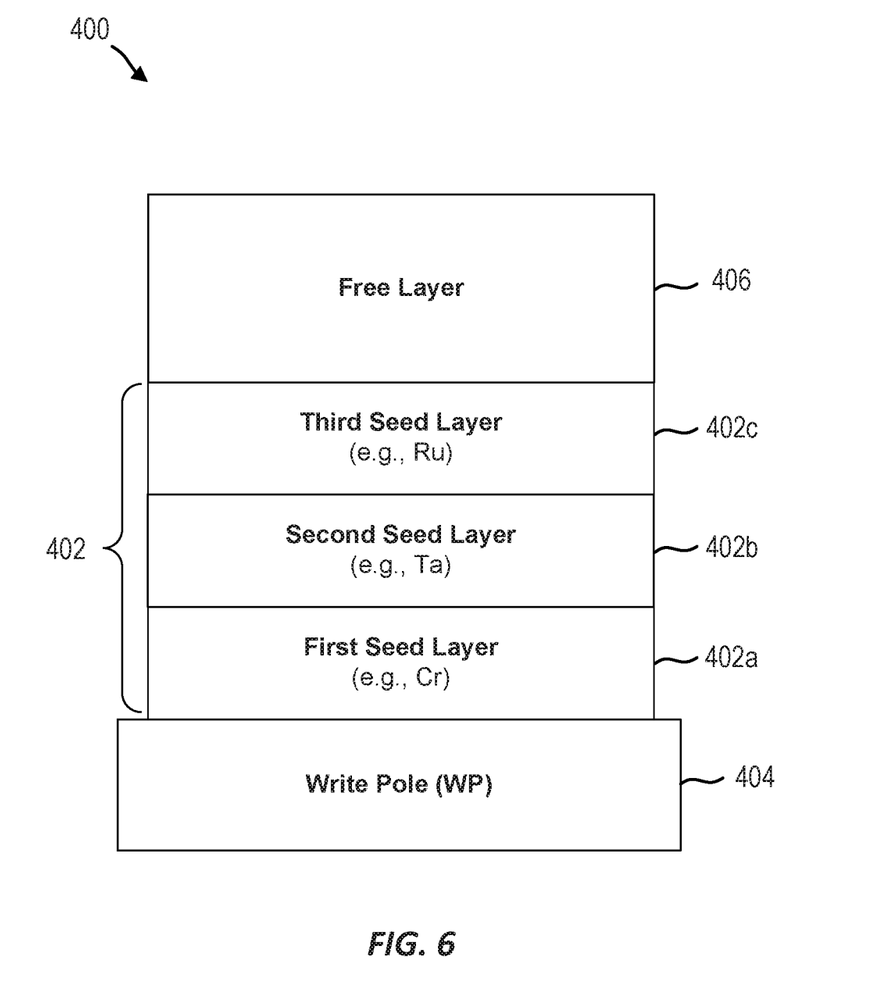
FIG. 6 is a sectional view of a portion of a STO showing a first multilayer seed layer disposed between the write pole and the free layer in accordance with an embodiment of the disclosure.

FIG. 6 is a sectional view of a portion of a STO 400 showing a first multilayer seed layer 402 disposed between a write pole 404 and a free layer 406 in accordance with an embodiment of the disclosure. In one aspect, the multilayer seed layer 402 can be used in in any of the STOs of FIGS. 1-5 (e.g., in place of seed layer 300 in FIGS. 4 and 5). The multilayer seed layer 402 includes a first seed layer 402a on write pole 404, a second seed layer 402b on the first seed layer 402a, and a third seed layer 402c on the second seed layer 402b. In one aspect, the multilayer seed layer 402 may include only two seed layers. In one such case, for example, the third seed layer 402c is not included (i.e., removed).

In one aspect, the first seed layer 402a can act as an underlayer to the second seed layer 402b. In one aspect, the first seed layer 402a can be made of a material such as Cr that provides a preselected degree of corrosion resistance.

In previous designs, a seed layer of Cu might have been used on the write pole 404 for the first seed layer 402a. However, write heads with STOs often get quite hot and the Cu may degrade (e.g., via oxidation) under such high heat conditions, especially when the Cu to write pole 404 interface is rough (e.g., where Cu is grown on the write pole and possibly Al2O3 adjacent to the write pole). As a result, the degraded Cu seed layer (e.g., with the poor interface to the write pole) develops high resistivity which causes several undesirable conditions including high switching current and increased interlayer coupling (Hin). The latter condition may cause problems with characterizing write head performance. The use of a high corrosion resistant material for the first seed layer 402a, such as Cr, can provide reduced resistivity of the seed layers, improved ferromagnetic coupling (Hin), and improved adhesion between the seed layers and adjacent layers. More specifically, the first seed layer 402a made of Cr and grown on materials such as AlO and CoFe shows improved interface roughness, and thus improved adhesion between the first seed layer 402a and write pole 404.

The second seed layer 402b can be made of a material such as Ta that acts as a seed layer for the free layer 406. In one aspect, the second seed layer 402b is Ta and is on the first seed layer 402a made of Cr. In such case, the Ta formed/grown on the Cr underlayer can have an alpha phase with reduced seed layer resistance. Power generated from the low resistance can reduce heat and prevent oxidation. An example with empirical results clarifies the improvements in resistivity. For a previous design STO seed layer of Cu/Ta on the WP 404, the resistivity was measured at about 200 ohms per sheet, while the resistivity of the improved STO seed layer of Cr/Ta was measured at about 23 ohms per sheet. Thus, the improvement is on the order of a resistivity reduction of about one order of magnitude (e.g., about 10 times less resistance).

The third seed layer 402c can be made of a material such as Ru that acts as a seed layer for the free layer 406, possibly in conjunction with the second seed layer 402b.

The ferromagnetic free layer 406 may be formed of conventional ferromagnetic materials such as NiFe and CoFe alloys, but may also be formed of or comprise a ferromagnetic Heusler alloy, some of which are known to exhibit high spin polarization in their bulk form. As described above, the polarizer 285 of FIG. 5 may also be made of a Heusler alloy layer. Full and half Heusler alloys are intermetallics with particular compositions and crystal structures. Examples of Heusler alloys include, but are not limited to, the full Heusler alloys Co2MnX (where X is one or more of Al, Sb, Si, Sn, Ga, or Ge) and Co2FeZ (where Z is one or more of Ge, Si, Al, Sn or Ga). Examples also include, but are not limited to, the half Heusler alloys NiMnSb, and PtMnSb. A perfect Heusler alloy will have 100% spin-polarization. However, it is possible that in a thin-film form and at finite temperatures, the band structure of the Heusler alloy may deviate from its ideal half metal structure and that the spin polarization will decrease. For example, some alloys may exhibit chemical site disorder and crystallize in the B2 structure instead of the L21 Heusler structure. Nevertheless, the spin polarization may exceed that of conventional ferromagnetic alloys. Thus, as used herein a "Heusler alloy" shall mean an alloy with a composition substantially the same as that of a known Heusler alloy, and which results in enhanced spin polarization compared to conventional ferromagnetic materials such as NiFe and CoFe alloys.

As described above, the write pole 404 functions as a first electrode and is formed of a ferromagnetic material. For example, the write pole 404 may be made of a high moment CoFe alloy. In one aspect, the CoFe alloy may include a third material to prevent corrosion or enhance other magnetic properties.

Figure 7:
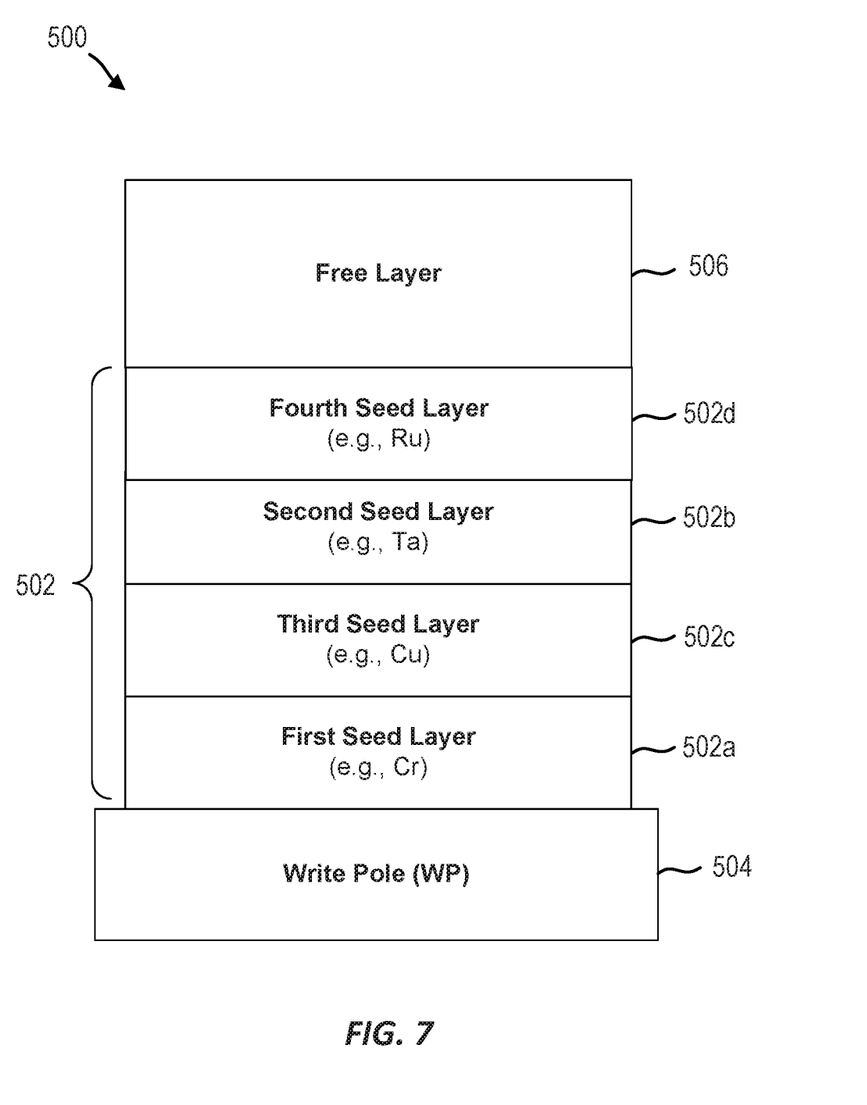
FIG. 7 is a sectional view a portion of a STO showing a second multilayer seed layer disposed between the write pole and the free layer in accordance with an embodiment of the disclosure.

FIG. 7 is a sectional view of a portion of a STO 500 showing a second multilayer seed layer 502 disposed between a write pole 504 and a free layer 506 in accordance with an embodiment of the disclosure. In one aspect, the multilayer seed layer 502 can be used in in any of the STOs of FIGS. 1-5 (e.g., in place of seed layer 300 in FIGS. 4 and 5). The multilayer seed layer 502 includes a stacked structure with a first seed layer 502a on write pole 504, a third seed layer 502c on the first seed layer 502a, a second seed layer 502b on the third seed layer 502c, and a fourth seed layer 502d on the second seed layer 502b.

In one aspect, the first seed layer 502a can act as an underlayer to the second seed layer 502b. In one aspect, the first seed layer 502a can be made of a material such as Cr that provides a preselected degree of corrosion resistance.

The third seed layer 502c can be made of a material such as Cu that also acts as an underlayer to the second seed layer 502b.

The second seed layer 502b can be made of a material such as Ta that acts as a seed layer for the free layer 506. In one aspect, the second seed layer 502b is Ta and is on the first seed layer 502a made of Cr. In such case, the Ta formed/grown on the Cr/Cu underlayers is mainly beta phase Ta that induces a strong Ru hexagonal closest packed (hcp) texture of the fourth seed layer 502d. This combination of layers then provides for growth of a strong face center cubic (fcc) textured free layer (e.g., free layer 506, which can be made of NiFe).

The fourth seed layer 502d can be made of a material such as Ru that also acts as a seed layer for the free layer 506, possibly in conjunction with the second seed layer 502b.

In one aspect, the characteristics of the components of the STO 500, including the material compositions, can be the same as the corresponding components illustrated in FIG. 6. More specifically, the materials of the write pole 504 and free layer 506 can be the same as those described above for the corresponding components (404, 406) illustrated in FIG. 6. Similar to the seed layers 402 in STO 400 of FIG. 6, the seed layers 502 can improve the interface between the write pole 504 and seed layers 502, particularly the first seed layer 502a, and thereby provide improved corrosion resistance for the write pole 504.

Figure 8:
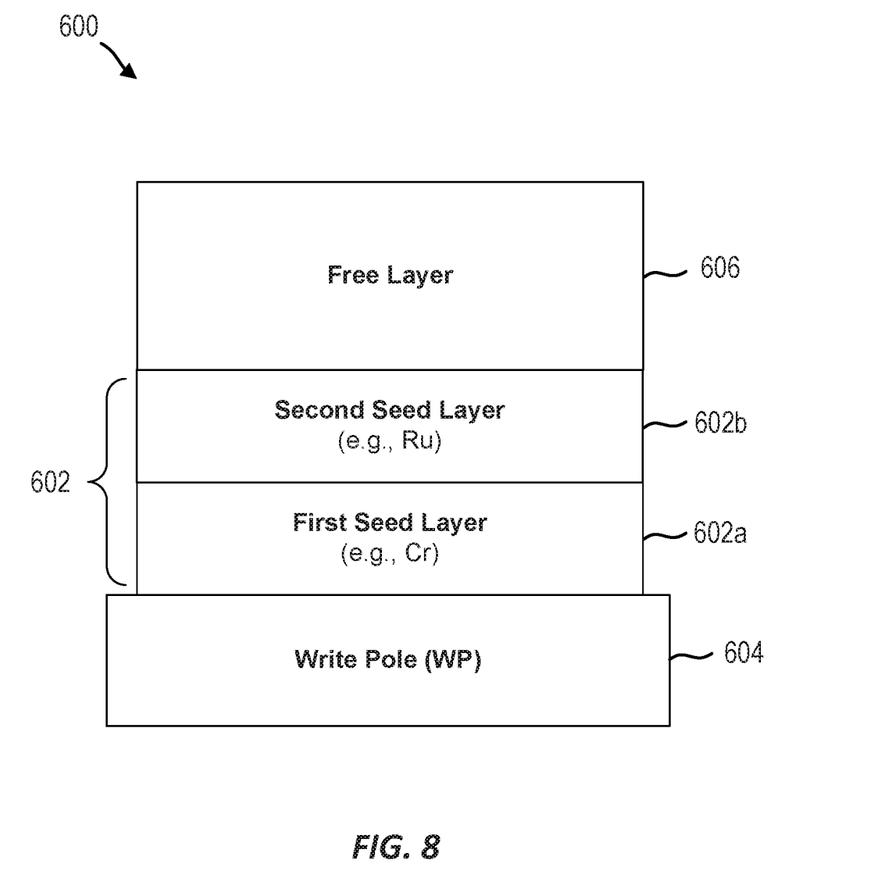
FIG. 8 is a sectional view a portion of a STO showing a third multilayer seed layer disposed between the write pole and the free layer in accordance with an embodiment of the disclosure.

FIG. 8 is a sectional view of a portion of a STO 600 showing a third multilayer seed layer 602 disposed between a write pole 604 and a free layer 606 in accordance with an embodiment of the disclosure. In one aspect, the multilayer seed layer 602 can be used in in any of the STOs of FIGS. 1-5 (e.g., in place of seed layer 300 in FIGS. 4 and 5). The multilayer seed layer 602 includes a stacked structure with a first seed layer 602a on write pole 604 and a second seed layer 602b on the first seed layer 602a.

In one aspect, the first seed layer 602a can act as an underlayer to the second seed layer 602b. In one aspect, the first seed layer 602a can be made of a material such as Cr that provides a preselected degree of corrosion resistance.

The second seed layer 602b can be made of a material such as Ru that also acts as a seed layer to the free layer 606, possibly in conjunction with the first seed layer 602a.

In one aspect, the characteristics of the components of the STO 600, including the material compositions, can be the same as the corresponding components illustrated in FIG. 6. More specifically, the materials of the write pole 604 and free layer 606 can be the same as those described above for the corresponding components (404, 406) illustrated in FIG. 6. As compared to the seed layer structures 402 and 502 of FIGS. 6 and 7, the seed layer structure 602 of FIG. 6 lacks a layer of Ta, which has a relatively high resistivity. As a result the seed layer structure 602 can have even lower resistance than seed layer structures 402 and 502. Similar to the seed layer structures 402 and 502 of FIGS. 6 and 7, the seed layer structure 602 can improve the interface between the write pole 604 and seed layers 602, particularly the first seed layer 602a, and thereby provide improved corrosion resistance for the write pole 604.

Figure 9:
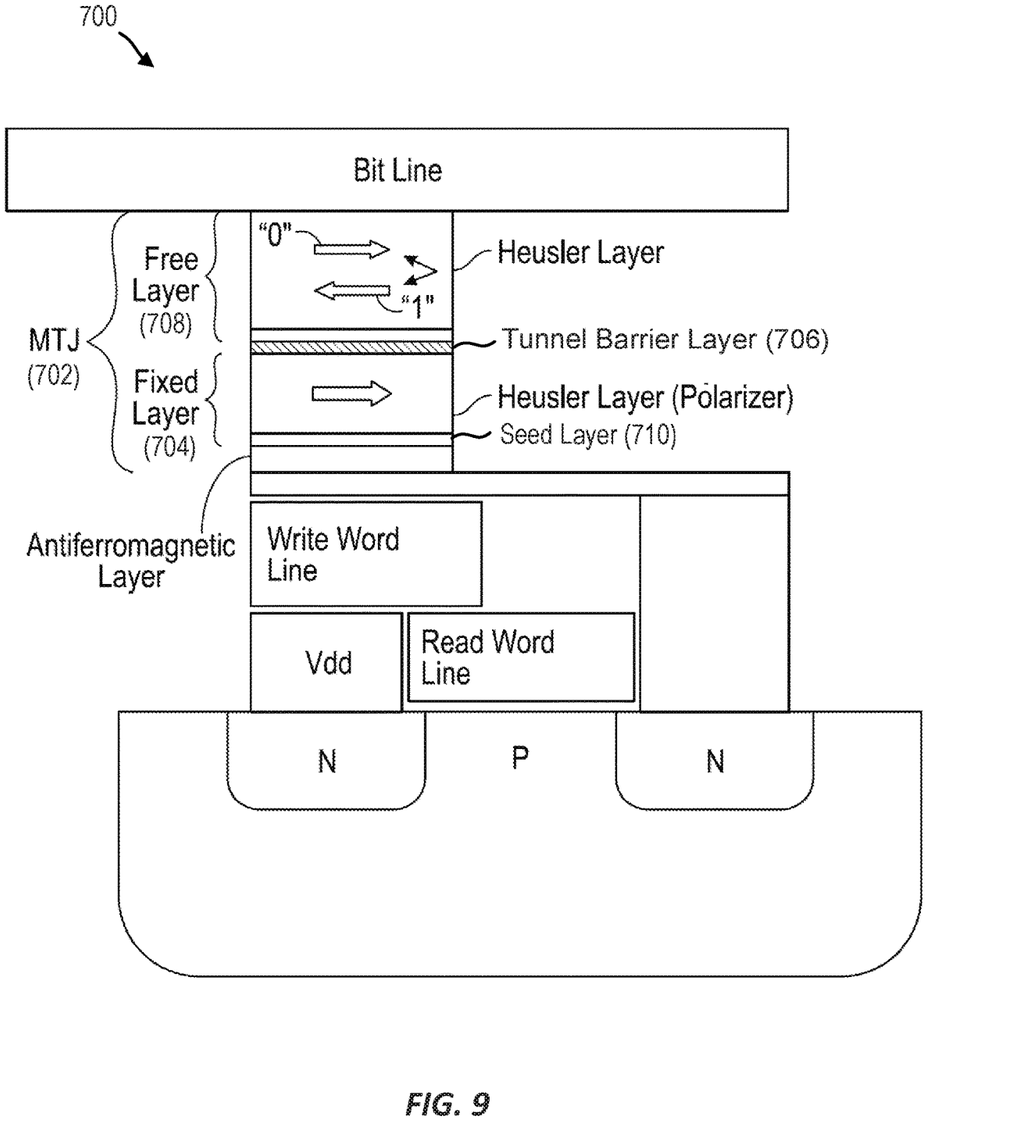
FIG. 9 is a view of a spin transfer torque magnetic random access memory (STT-MRAM) in-plane magnetic tunnel junction (MTJ) cell including a multilayer seed layer in accordance with an embodiment of the disclosure.

FIG. 9 is a view of a spin transfer torque magnetic random access memory (STT-MRAM) in-plane magnetic tunnel junction (MTJ) cell 700 including a multilayer seed layer in accordance with an embodiment of the disclosure. In a MRAM structure, the STT device is a MTJ cell 702 that includes a ferromagnetic pinned or fixed layer 704, a dielectric tunnel barrier layer (like a MgO tunnel barrier layer) 706, a ferromagnetic free layer 708, and a multilayer seed layer 710. The seed layer 710 may be implemented using any of the seed layers described herein (e.g., seed layer 402, 502, 602). The fixed layer 704 acts as the polarizing layer for the source of spin-polarized electrons. The orientation of the magnetization of the fixed layer 704 is fixed in the presence of STT current, while the orientation of the magnetization of the free layer 708 is capable of switching from a parallel configuration with respect to that of the fixed layer (low resistance state by "0") to an antiparallel configuration (high resistance state or "1") by applying STT current through the MTJ cell. Thus, two binary states can be realized for digital data storage in the MRAM.

In one aspect, each of the fixed and free layers includes a Heusler alloy as described above. While FIG. 9 depicts an in-plane MTJ cell 700, the STT-MRAM may also be one with MTJ cells where each of the fixed and free layers has its magnetization oriented perpendicular-to-the-plane. In a perpendicular MTJ cell, the Heusler alloy fixed layer may be coupled to a ferromagnetic multilayer with perpendicular magnetic anisotropy, like a Co/Pt or Co/Pd multilayer, and the Heusler alloy free layer may be coupled to a Co/Ni ferromagnetic multilayer to achieve perpendicular magnetization.

In one aspect, cell 700 may be a STT device where the polarizing layer that has a substantially fixed magnetization direction, and the spacer layer includes a magnetic tunnel junction (MTJ) tunnel barrier layer. In one aspect, the magnetization directions of each of the free and polarizing layers can be substantially perpendicular to the planes of the free and polarizing layers.

In one aspect, the seed layer 710 can provide low resistance to the MRAM stack to reduce overall switching voltage requirements. In addition, the bottommost layer of the seed layer 710 can be made of a material such as Cr with good adhesion properties for many possible underlayer materials. In one aspect, an entire STO structure like that depicted in FIG. 5, containing for example a stack of seed/freelayer/spacer/cap, can be applied to a STT MRAM cell such that high and low resistance states are obtained by spin torque switching.

FIG. 10 is a flow chart illustrating a process 800 for fabricating a multilayer seed layer in accordance with an embodiment of the disclosure. In particular embodiments, the process 800 can be used to fabricate any of the STOs of FIGS. 1-9. In one aspect, the process 800 can be used to fabricate any of the STOs and sub-component multilayer seed layers of FIGS. 6-7. In block 802, the process provides a substrate. In one aspect, the substrate may be a write pole (e.g., 240, 404, 504, 604) of a write head. In block 804, the process provides a first seed layer directly on the substrate, where the first seed layer includes Cr, or possibly another suitable seed layer material that provides a preselected degree of corrosion resistance. In block 806, the process provides a second seed layer on the first seed layer, where the second seed layer includes Ta, or possibly another material that is suitable for acting as a seed layer for a ferromagnetic free layer.

In block 808, the process provides a ferromagnetic free layer on the second seed layer. In one aspect, the free layer may be made of any of the materials described above for this layer. In block 810, the process provides a ferromagnetic polarizing layer. In one aspect, the polarizing layer may be made of any of the materials described above for this layer. In block 812, the process provides a nonmagnetic spacer layer between the free layer and the polarizing layer.

In one aspect, the actions of blocks 804 to 812 can form a stack of layers on the substrate, where the stack effectively forms a STO or STT type device.

In one embodiment, the process can perform the sequence of actions in a different order. In another embodiment, the process can skip one or more of the actions. In other embodiments, one or more of the actions are performed simultaneously. In some embodiments, additional actions can be performed.

The terms "made of" or "includes" as used herein for describing possible materials for particular layers of a STT/STO device can be either open ended or closed. More specifically, in one aspect, these terms may be synonymous with the term "comprises" such that additional materials may also be included. In another aspect, these terms may be synonymous with the term "consists of" such that additional materials may not be included.

The terms "above," "below," and "between" as used herein refer to a relative position of one layer with respect to other layers. As such, one layer deposited or disposed above or below another layer may be directly in contact with the other layer or may have one or more intervening layers. Moreover, one layer deposited or disposed between layers may be directly in contact with the layers or may have one or more intervening layers.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A spin transfer torque (STT) device comprising:
   a substrate; and
   a stack of layers formed on the substrate and comprising:
      a first seed layer directly on the substrate and comprising Cr;
      a second seed layer on the first seed layer and comprising Ta;
      a ferromagnetic free layer on the second seed layer;
      a ferromagnetic polarizing layer; and
      a nonmagnetic spacer layer between the ferromagnetic free layer and the ferromagnetic polarizing layer, wherein the stack of layers further comprises a third seed layer comprising Cu, wherein the third seed layer is between the first seed layer and the second seed layer.

2. The STT device of claim 1, wherein the stack of layers further comprises a fourth seed layer on the second seed layer and comprising Ru, and wherein the ferromagnetic free layer is on the fourth seed layer.

3. An STT magnetic random access memory (MRAM) cell comprising the STT device of claim 1, wherein the ferromagnetic polarizing layer has a substantially fixed magnetization direction, and wherein the spacer layer comprises a magnetic tunnel junction (MTJ) tunnel barrier layer.

4. The STT MRAM cell of claim 3, wherein the magnetization directions of each of the ferromagnetic free and ferromagnetic polarizing layers are substantially perpendicular to the planes of the ferromagnetic free and ferromagnetic polarizing layers.

5. A MRAM storage device comprising a plurality of STT MRAM cells, each according to claim 3.

6. A spin transfer torque (STT) device comprising:
   a substrate, wherein the substrate is a magnetic write pole of a magnetic recording write head for magnetizing regions in a magnetic recording layer; and
   a stack of layers formed on the substrate and comprising:
      a first seed layer directly on the substrate and comprising Cr;
      a second seed layer on the first seed layer and comprising Ta;
      a ferromagnetic free layer on the second seed layer;
      a ferromagnetic polarizing layer; and
      a nonmagnetic spacer layer between the ferromagnetic free layer and the ferromagnetic polarizing layer, wherein the write head includes a trailing shield, and wherein the ferromagnetic polarizing layer comprises the trailing shield.

7. The STT device of claim 6, wherein the write head includes a trailing shield, wherein the stack is located between the write pole and the trailing shield and further comprises a capping layer between the ferromagnetic polarizing layer and the trailing shield.

8. The STT device of claim 6, further comprising electrical circuitry coupled to the device and wherein the ferromagnetic free layer is configured to provide microwave-assisted magnetic recording to the recording layer in the presence of current through the electrical circuitry.

9. The STT device of claim 6, wherein the stack of layers further comprises a third seed layer on the second seed layer and comprising Ru, and wherein the ferromagnetic free layer is on the third seed layer.

10. A spin transfer torque (STT) device comprising:
a substrate; and
a stack of layers formed on the substrate and comprising:
a first seed layer directly on the substrate and comprising Cr;
a second seed layer on the first seed layer and comprising Ta;
a ferromagnetic free layer on the second seed layer;
a ferromagnetic polarizing layer, wherein the ferromagnetic free layer comprises a ferromagnetic Heusler alloy selected from the group consisting of Co2MnX (where X is selected from the group consisting of Al, Sb, Si, Sn, Ga, and Ge), Co2FeZ (where Z is selected from one or more of Ge, Si, Al, Sn or Ga), NiMnSb and PtMnSb; and
a nonmagnetic spacer layer between the ferromagnetic free layer and the ferromagnetic polarizing layer.

11. A spin transfer torque (STT) device comprising:
a substrate; and
a stack of layers formed on the substrate and comprising:
a first seed layer directly on the substrate and comprising Cr;
a second seed layer on the first seed layer and comprising Ta;
a ferromagnetic free layer on the second seed layer;
a ferromagnetic polarizing layer, wherein the ferromagnetic polarizing layer comprises an alloy selected from the group consisting of CoFe and a Heusler alloy layer, wherein the Heusler alloy is selected from the group consisting of Co2MnX (where X is selected from the group consisting of Al, Sb, Si, Sn, Ga, and Ge), Co2FeZ (where Z is selected from one or more of Ge, Si, Al, Sn or Ga), NiMnSb and PtMnSb; and
a nonmagnetic spacer layer between the ferromagnetic free layer and the ferromagnetic polarizing layer.

12. A spin transfer torque (STT) device comprising:
a substrate; and
a stack of layers formed on the substrate and comprising:
a first seed layer directly on the substrate and comprising Cr;
a second seed layer directly on the first seed layer and comprising Ru;
a ferromagnetic free layer on the second seed layer, wherein the ferromagnetic free layer comprises a ferromagnetic Heusler alloy selected from the group consisting of Co2MnX (where X is selected from the group consisting of Al, Sb, Si, Sn, Ga, and Ge), Co2FeZ (where Z is selected from one or more of Ge, Si, Al, Sn or Ga), NiMnSb and PtMnSb;
a ferromagnetic polarizing layer; and
a nonmagnetic spacer layer between the ferromagnetic free layer and the ferromagnetic polarizing layer.

13. The STT device of claim 12, wherein the substrate is a magnetic write pole of a magnetic recording write head for magnetizing regions in a magnetic recording layer.

14. The STT device of claim 13, wherein the write head includes a trailing shield, and wherein the ferromagnetic polarizing layer comprises the trailing shield.

15. The STT device of claim 13, wherein the write head includes a trailing shield, wherein the stack is located between the write pole and the trailing shield and further comprises a capping layer between the ferromagnetic polarizing layer and the trailing shield.

16. The STT device of claim 13, further comprising electrical circuitry coupled to the device and wherein the ferromagnetic free layer is configured to provide microwave-assisted magnetic recording to the recording layer in the presence of current through the electrical circuitry.

17. An STT magnetic random access memory (MRAM) cell comprising the STT device of claim 12, wherein the ferromagnetic polarizing layer has a substantially fixed magnetization direction, and wherein the spacer layer comprises a magnetic tunnel junction (MTJ) tunnel barrier layer.

18. The STT MRAM cell of claim 17, wherein the magnetization directions of each of the ferromagnetic free and ferromagnetic polarizing layers are substantially perpendicular to the planes of the ferromagnetic free and ferromagnetic polarizing layers.

19. A MRAM storage device comprising a plurality of STT MRAM cells, each according to claim 17.

20. A spin transfer torque (STT) device comprising:
a substrate; and
a stack of layers formed on the substrate and comprising:
a first seed layer directly on the substrate and comprising Cr;
a second seed layer directly on the first seed layer and comprising Ru;
a ferromagnetic free layer on the second seed layer;
a ferromagnetic polarizing layer wherein the ferromagnetic polarizing layer comprises an alloy selected from the group consisting of CoFe and a Heusler alloy layer, wherein the Heusler alloy is selected from the group consisting of Co2MnX (where X is selected from the group consisting of Al, Sb, Si, Sn, Ga, and Ge), Co2FeZ (where Z is selected from one or more of Ge, Si, Al, Sn or Ga), NiMnSb and PtMnSb; and
a nonmagnetic spacer layer between the ferromagnetic free layer and the ferromagnetic polarizing layer.

21. The STT device of claim 20, wherein the substrate is a magnetic write pole of a magnetic recording write head for magnetizing regions in a magnetic recording layer.

22. The STT device of claim 21, wherein the write head includes a trailing shield, and wherein the ferromagnetic polarizing layer comprises the trailing shield.

23. The STT device of claim 21, wherein the write head includes a trailing shield, wherein the stack is located between the write pole and the trailing shield and further comprises a capping layer between the ferromagnetic polarizing layer and the trailing shield.

24. The STT device of claim 21, further comprising electrical circuitry coupled to the device and wherein the ferromagnetic free layer is configured to provide microwave-assisted magnetic recording to the recording layer in the presence of current through the electrical circuitry.

25. An STT magnetic random access memory (MRAM) cell comprising the STT device of claim 20, wherein the ferromagnetic polarizing layer has a substantially fixed magnetization direction, and wherein the spacer layer comprises a magnetic tunnel junction (MTJ) tunnel barrier layer.

26. The STT MRAM cell of claim 25, wherein the magnetization directions of each of the ferromagnetic free and ferromagnetic polarizing layers are substantially perpendicular to the planes of the ferromagnetic free and ferromagnetic polarizing layers.

27. A MRAM storage device comprising a plurality of STT MRAM cells, each according to claim 25.

28. A method for fabricating a spin transfer torque (STT) device, comprising:
    providing a substrate; and
    providing a stack of layers on the substrate, the providing the stack comprising:
        providing a first seed layer directly on the substrate and comprising Cr;
        providing a second seed layer on the first seed layer and comprising Ta;
        providing a third seed layer comprising Cu, wherein the third seed layer is between the first seed layer and the second seed layer;
        providing a ferromagnetic free layer on the second seed layer;
        providing a ferromagnetic polarizing layer; and
        providing a nonmagnetic spacer layer between the ferromagnetic free layer and the ferromagnetic polarizing layer.

29. The method of claim 28, further comprising providing a fourth seed layer on the second seed layer and comprising Ru, and wherein the ferromagnetic free layer is on the fourth seed layer.

* * * * *